US012760717B2

(12) United States Patent
Bitondo

(10) Patent No.: US 12,760,717 B2
(45) Date of Patent: Oct. 13, 2026

(54) THERMOELECTRIC HYDRO ENERGY HARVESTER

(71) Applicant: Steven Michael Bitondo, White Plains, NY (US)

(72) Inventor: Steven Michael Bitondo, White Plains, NY (US)

( * ) Notice: Subject to any disclaimer, the term of this patent is extended or adjusted under 35 U.S.C. 154(b) by 0 days.

(21) Appl. No.: 18/586,465

(22) Filed: Feb. 24, 2024

(65) Prior Publication Data

US 2025/0270982 A1 Aug. 28, 2025

(51) Int. Cl.
*F03G 7/05* (2006.01)
*H10N 10/80* (2023.01)

(52) U.S. Cl.
CPC ............... *F03G 7/05* (2013.01); *H10N 10/80* (2023.02); *F05B 2260/20* (2013.01); *F05B 2260/60* (2013.01)

(58) Field of Classification Search
CPC ....... F03G 7/05; H10N 10/80; F05B 2260/20; F05B 2260/60
USPC ........................................................ 60/641.7
See application file for complete search history.

(56) References Cited

U.S. PATENT DOCUMENTS 4,311,012 A * 1/1982 Finley ....................... F03G 7/05 60/641.7
4,355,513 A * 10/1982 Girden ...................... F03G 7/05 417/108
2009/0217664 A1* 9/2009 Rapp ......................... F03G 7/04 60/641.2
2010/0139271 A1* 6/2010 Howard .................... F03G 7/05 290/52
2010/0139272 A1* 6/2010 Howard .................. F24V 50/00 290/52
2014/0096520 A1* 4/2014 Paya Diaz ................ F03G 7/05 60/671
2016/0099398 A1* 4/2016 Lorimer ................. H10N 10/80 136/212

* cited by examiner

*Primary Examiner* — Hoang M Nguyen

(57) ABSTRACT

A Thermoelectric Hydro Energy Harvester also known as the THEH is a stationary, self-contained and self-sustaining electrical generation system. The THEH system comprises an electrical generation system using multiple fluid pumps and thermal electrical generators (TEG) to generate electricity by exploiting the temperature differences in bodies of water at various depths, insulated piping, basic fundamentals of fluid dynamics and specialty designed heat exchangers.

8 Claims, 5 Drawing Sheets

THERMOELECTRIC HYDRO ENERGY HARVESTER

FIELD OF THE INVENTION

This invention relates to electrical power generation using bodies of water at different depths to transfer heat flux across thermoelectric generators.

BACKGROUND OF INVENTION

Harnessing renewable energy sources remains a pivotal aspect of global efforts to reduce reliance on fossil fuels and mitigate environmental impact. Particularly, thermoelectric generators (TEGs), via the Seeback effect, a phenomenon in which a temperature difference between two dissimilar electrical conductors or semiconductors produces a voltage. These generators operate on the principle of differential temperatures, turning heat flux (the flow of energy per unit of area per unit of time) across the device into usable electrical power.

One of the challenges in maximizing the source of temperature differential and practicality of TEGs is their integration into systems that are both efficient and manageable. Many existing systems aiming to utilize TEGs are complex, with multiple moving parts which can lead to increased maintenance requirements, potential mechanical failures, and subsequently higher operational costs.

The present invention is designed to efficiently utilize these natural temperature differences in bodies of water, particularly oceans, by implementing a straightforward design requiring minimal moving parts. The reduction in moving parts is achieved through an incorporation of TEGs into a fluid-to-plate heat exchanger. Unlike conventional heat exchangers, THEH is engineered to maintain a constant temperature difference across the TEGs, making the most efficient use of the Seebeck effect, rather than facilitating heat transfer between the fluids.

In this invention the source of the temperature difference will come from natural environments like oceans and other bodies of water. In most bodies of water, the surface temperature is significantly warmer due to the absorption of sunlight and atmospheric temperatures than water found at the depths where sunlight and the atmosphere cannot reach. In the oceans this is called the thermocline, a layer in large bodies of water where the temperature gradient is steepest and provides a natural and enormous source of differential temperatures.

The Thermoelectric Hydro Energy Harvester (THEH) is positioned in the renewable energy landscape, offering distinctive advantages over other prevalent forms of renewable energy such as solar and wind power. These advantages are fundamental to the THEH's operational principles and functional design because the THEH is not limited to the need of direct sunlight or constant wind to produce energy, such as solar and wind turbines, respectively.

SUMMARY OF THE INVENTION

The Thermoelectric Hydro Energy Harvester (THEH) is a system of power generation that uses fluid-to-plate heat exchangers to expose each side of an array of TEGs to sources of water with natural temperature differences. More specifically the warmer surface water and colder deeper water found in oceans and other large bodies of water. This will create a continuous and sustainable energy source not dependent on direct sunlight or continuous wind. The present invention provides a system that will be placed above the surface of a body of water and will not be submersible. This system may be in the form of, but not limited to, a large building on land near a large body of water, an entire or partial oil drilling rig, small portable box made to be taken on small vessels or mobile units installed on ships.

DETAILED DESCRIPTION

Figure 1:
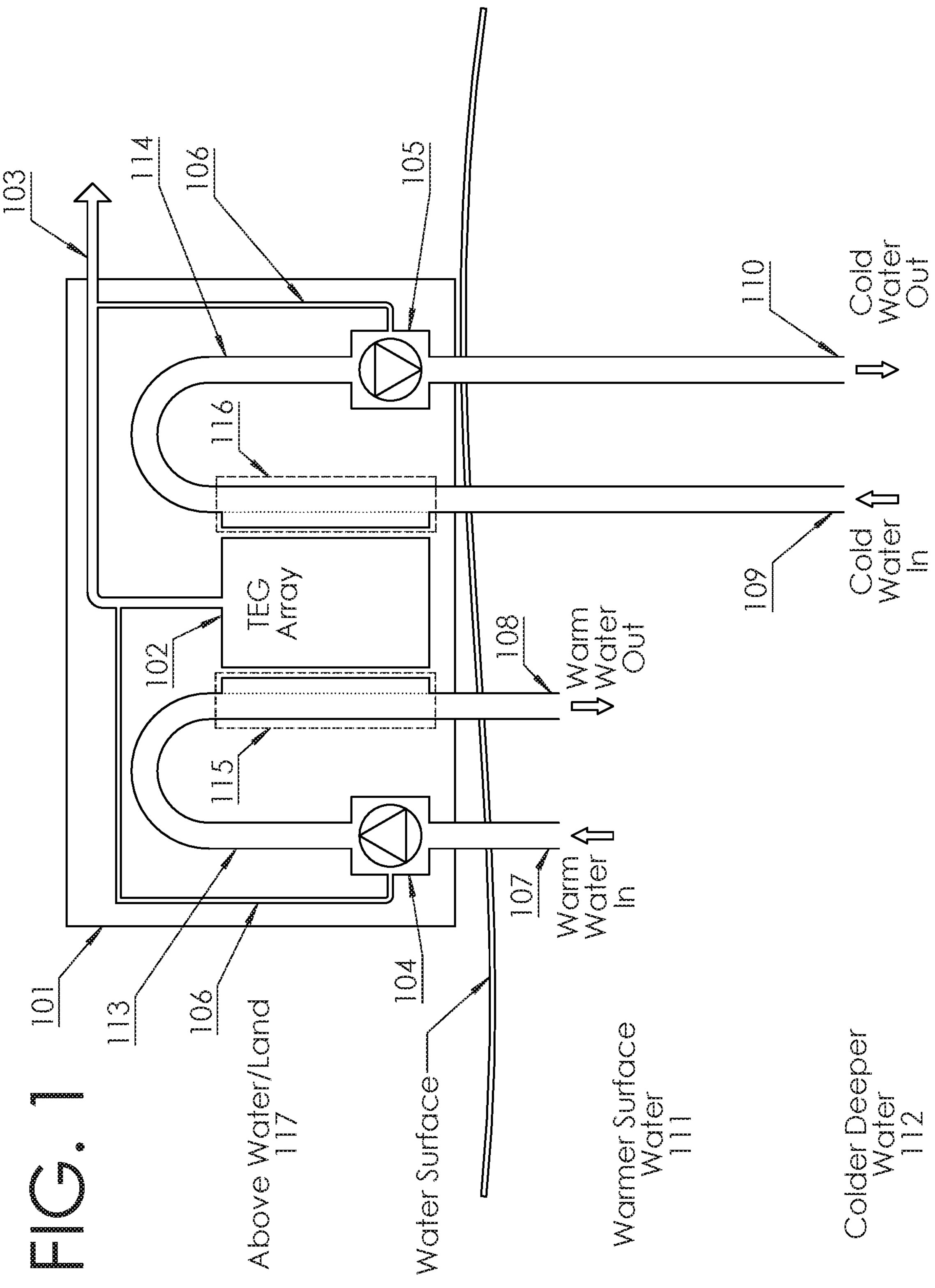
FIG. 1 depicts a schematic diagram and major components of the THEH system.

FIG. 1 depicts a schematic diagram of the THEH system. The THEH system 101 comprises a warm side fluid pump 104, a cold side fluid pump 105, warm side insulated piping 113, cold side insulated piping 114, warm side fluid heat exchanger 115, cold side fluid heat exchanger 116 and a TEG array 102.

The THEH system 101 is an above water energy power plant that uses warm surface water 111 and colder deeper water 112 to create electricity via a temperature differential across a TEG array 102. The thermal difference across the TEG array 102 is achieved by the warm side pump 104 and cold side pump 105 circulating warmer surface water and colder deeper water to and throughout the THEH system 101. The use of warm side insulated piping 113 and cold side insulated piping 114 where appropriate to ensure the colder water 112 from the deeper depths maintains its low temperatures as it ascends to the surface preventing heat absorption from the surrounding warmer layers of water and atmosphere. This is also the reason that warm side insulated piping 113 is used where appropriate to ensure the warmer water 111 from the surface maintains its higher temperatures. These two isolated flows of water are then used to transfer thermal energy to and from the TEG array 102 by use of the warm side fluid heat exchanger 115 and cold side fluid heat exchanger 116 providing the temperature difference needed to produce DC power which then can be later made into more usable AC power if needed. Each of the heat exchangers used in this system do not function to transfer heat from fluid to fluid. Instead, they are used to ensure a constant temperature difference across the TEG array 102 for purposes of energy generation. The heat exchanger plates are in physical thermal contact with each side of the TEG array 102 and the heat flux passing though the TEG modules will then produce electricity.

The depth of the warmer surface water 111 from the first depth and colder deeper water 112 from the second depth shall be chosen to ensure the maximum temperature difference with consideration for the cost of length of the warm side insulated piping 113 and cold side insulated piping 114 as well as the cost of installation and maintenance of such insulated piping.

The design of this system will have the warm water inlet 107 and warm water outlet 108 submerged at similar depths as well as the cold water inlet 109 and cold water outlet 110 submerged at similar depths. This arrangement of similar depth inlet and outlet for the same piping will create a low-pressure differential within each respective pipe. This low-pressure differential within the pipes reduces the energy required to circulate the water through the THEH system. Most of the energy needed to pump the water or fluid throughout the system is attributed to head pressure such as friction losses and pressure losses but not elevation changes. This design ensures that the pumps operate with reduced energy consumption to maintain optimal flow rates and temperature differentials for maximum electricity generation of the THEH system.

To start the system an external power source (battery or grid) is needed to temporarily run the warm side fluid pump 104 and cold side fluid pump 105 so the respective heat exchangers and TEG array 101 can reach and maintain a temperature difference to produce electrical power to become self-sustaining and run the warm and cold side water pump through an electrical connection 106 and also produce excess power 103. To maintain the most efficient and constant power production, temperature, pressure, and flow sensors will be used to monitor and adjust various parameters of the THEH system 101.

In the operational context of the Thermoelectric Hydro Energy Harvester (THEH), the configuration of flow of the warmer surface water 111 from the first depth and colder deeper water 112 from the second depth flow plays a pivotal role in optimizing the efficiency of energy conversion.

Figure 2:
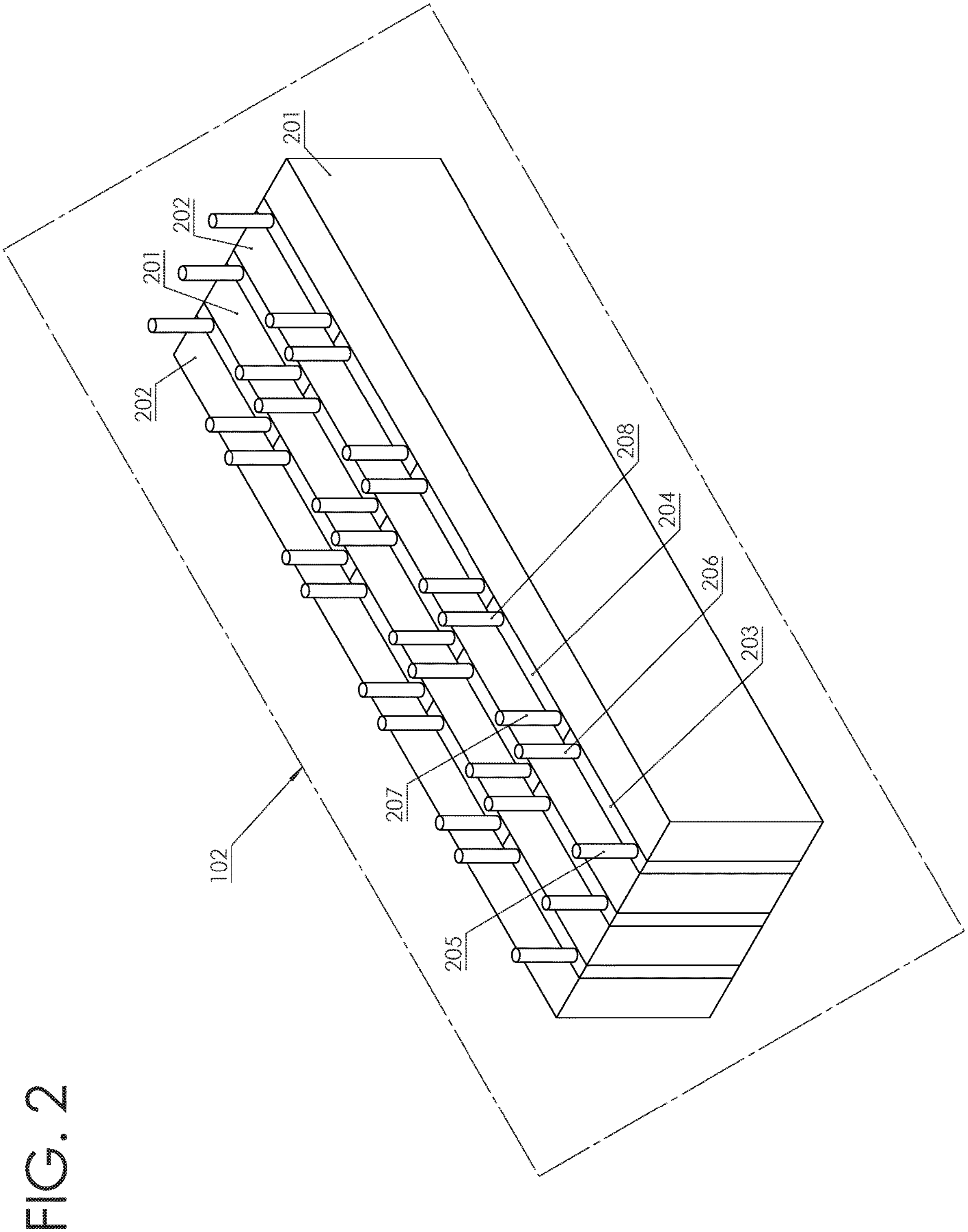
FIG. 2 depicts a TEG array and its major components.

FIG. 2 depicts the TEG array 102 where the warm side fluid-to-plate heat exchangers 201 and cold side fluid-to-plate heat exchangers 202 are simple aluminum blocks with where heat is thermally transferred to a TEG module 203 within the TEG array 102. Like batteries, if TEG modules are electrically connected in series, negative lead 206 of the first TEG module 203 to the positive lead 207 of the second TEG module 204 in a daisy chain configuration, the total voltage will increase across the positive lead 205 of the first TEG module 203 and the negative lead 208 of the second TEG module 204. However, when TEG modules are connected in parallel, positive lead 205 of the first TEG module 203 to the positive lead 207 of the second TEG module 204 and the negative lead 206 of the first TEG module 203 to the negative lead 208 of the second TEG module 204, the current will increase keeping the voltage the same. The TEG array 102 will use a combination of both connection methods, parallel and series, to suit the specific need at hand. This makes THEH system flexible and able to meet different power needs efficiently.

The modular nature of the TEG array 102 allows the THEH system 101 to adapt to various electricity demands. If a small population along a coast has a small electricity demand, smaller pipes, less heat exchangers, smaller pumps and a smaller TEG array can be used. Conversely if a large population along a coast has a large electricity demand, larger pipes, more heat exchangers, larger pumps, and a larger TEG array will be needed suit their needs.

Figure 3:
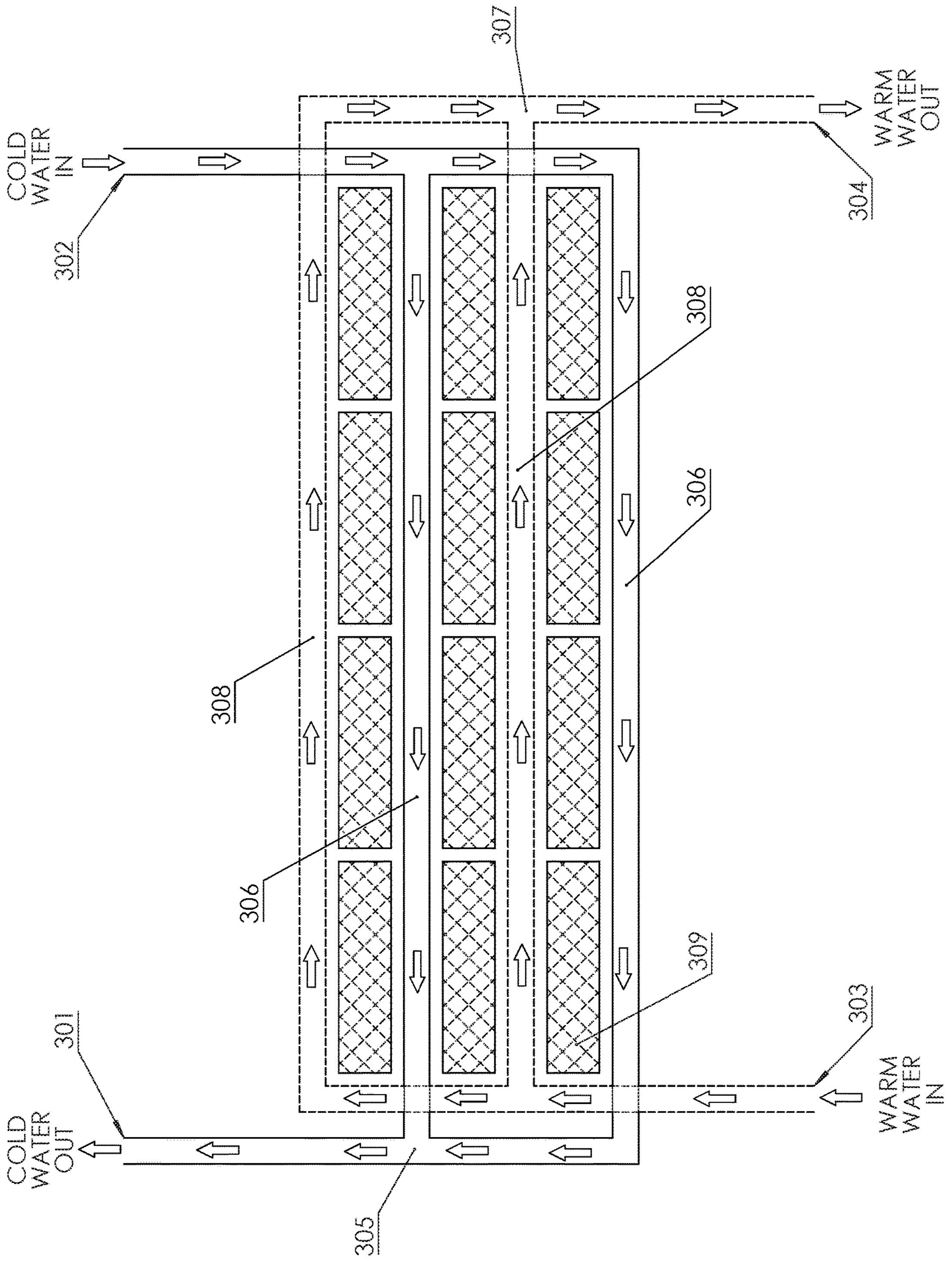
FIG. 3 depicts a fluid flow diagram to explain the primarily parallel flow of water across the TEG array.

As depicted in the schematic of FIG. 3 a primarily parallel flow setup where the warm inlet water 303 is split into multiple smaller streams of warm water 308 and the cold inlet water 302 is split into multiple smaller streams of cold water 306. This ensures that more of the TEG modules 309 will encounter the same warm and cold temperature water simultaneously. This will allow each TEG module 309 to be exposed to a more consistent temperature differential.

Comparable to the electrical connections explained previously, in the TEG array 102 described in FIG. 3 the warm water inlet 303 will split into multiple smaller streams of warm water 308 to interact with the individual TEG modules 309 in a series configuration until the piping is joined back together 307 into a parallel configuration and sent to the warm water outlet 304. Similarly, the cold water inlet 302 will split into multiple smaller streams of cold water 306 to interact with the individual TEG modules 309 in a series configuration until the piping is joined back together 305 and sent to the cold water outlet 301. The length of the series TEG modules shall be determined by the power generation of the last TEG in line vs its cost in the system. There will be a point of diminishing returns for the last TEG in the series configuration before another parallel connection is made to the initial warm and cold water source.

In a primarily series flow configuration (not shown) the water temperature differential is progressively reduced as it travels past successive TEG modules. Each subsequent TEG encounters water that is either cooler, for the warm side, or warmer, for the cold side, than the preceding one. Therefore, the energy conversion efficiency of TEGs with water flow in series declines progressively.

Figure 4:
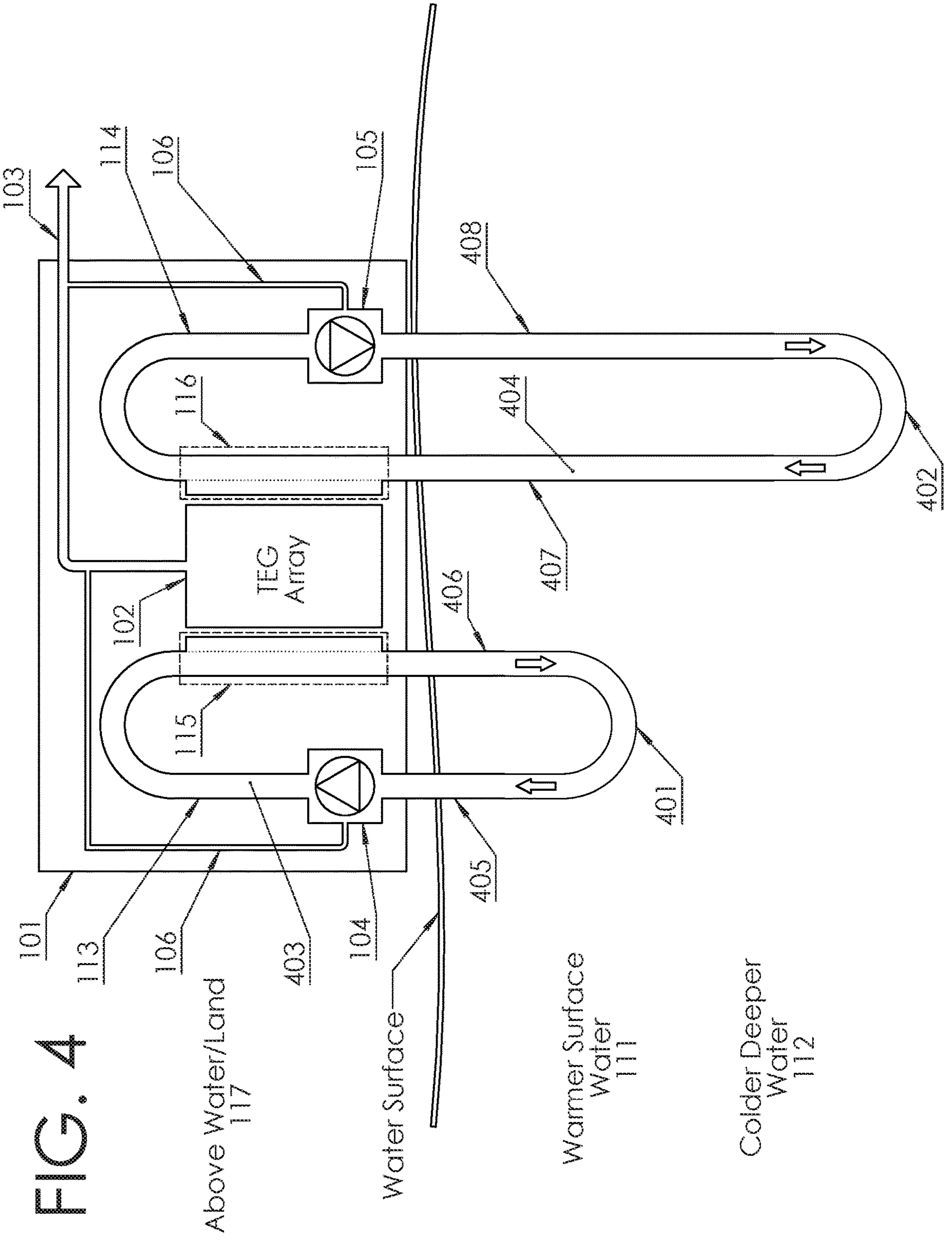
FIG. 4 depicts a schematic diagram of the THEH system where the warm and cold fluids are contained within separate closed loop partially thermally insulated piping systems.

FIG. 4 depicts an alternative method of heat absorption different from the primary method described in FIG. 1. This alternate embodiment of the THEH system uses a closed loop fluid system. In this closed loop system, the same fluid will be reused and heated or cooled via a partially insulated pipe at specific depths. The warm fluid 403 in the insulated pipe will travel from the warm side heat exchanger 115 to the warm surface of the body of water in a non-insulated pipe 406 until it reaches a desired warm temperature where it will return 401 to the THEH system 101 in the insulated section of the pipe 405. Similarly, the cold water solution 404 will travel in a non-insulated pipe 408 from the heat exchangers at the surface to the depths of the body of water until it reaches a desired cold temperature before returning 402 to the surface in an insulated section of the pipe 407. This would provide a more dependable THEH system where possible contaminants from the body of water could possibly cause obstructions in the pump, pipes and heat exchangers. This alternative design would also allow the use of different fluids to be used within the closed system. One such fluid could be a water/glycol mixture to prevent the freezing of the fluid when exposed to the cooler temperatures at the ocean's depth. It will also allow different thermal masses to be used, such as but not limited to geothermal, hydrothermal vents and volcanically heated water.

Figure 5:
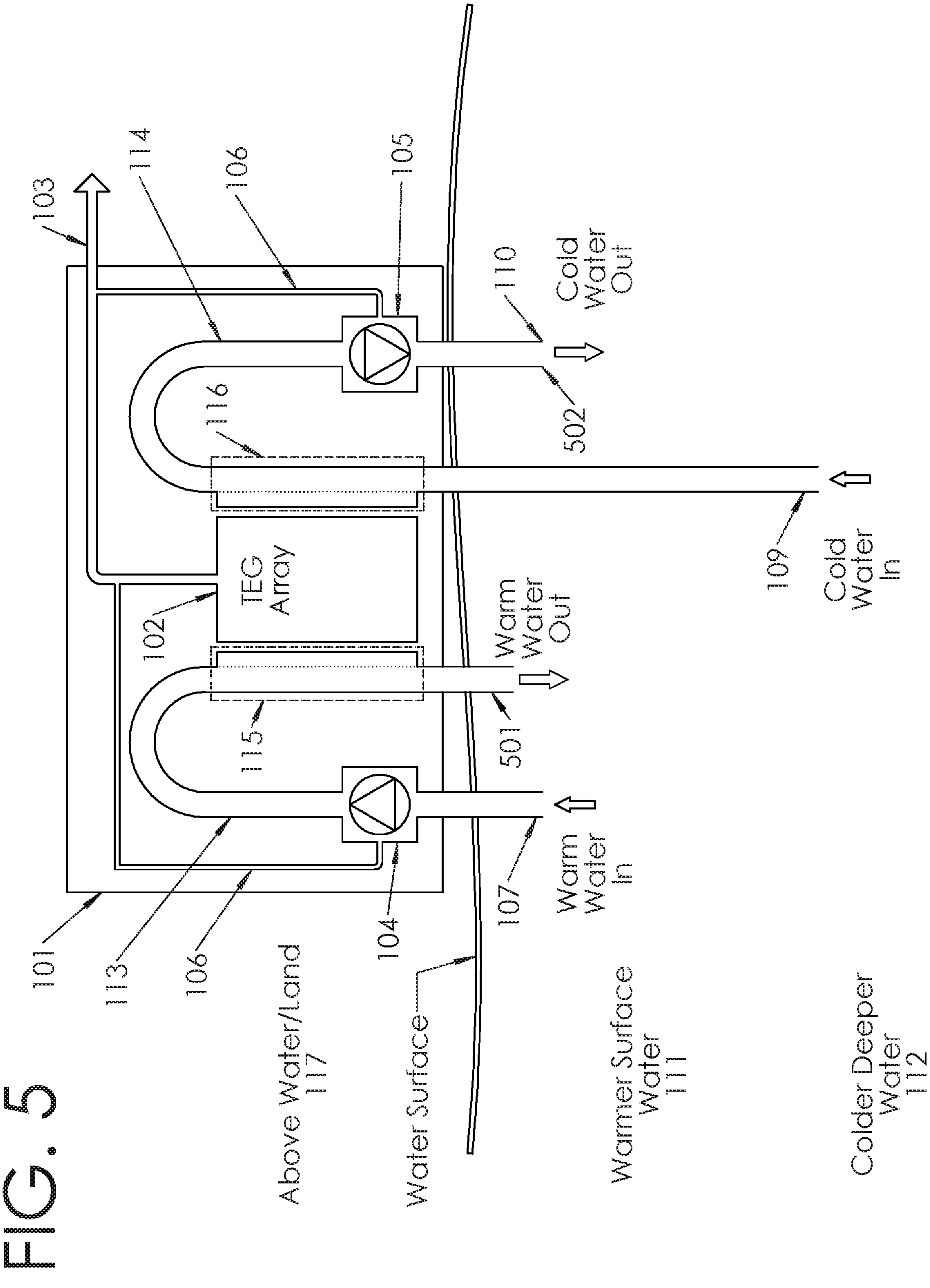
FIG. 5 depicts a schematic diagram of the THEH system where the warm and cold water discharge at different depths than their respective inlets to lower the temperature of the surrounding water.

In addition to its generating electricity, the THEH system also has environmental benefits as it offers the distinctive benefit of mitigating the impacts of rising ocean temperatures. Due to the temperature difference across the TEGs the warmer surface water from the first depth will discharge as a cooler temperature. FIG. 5 depicts strategic discharging the cold water at a secondary depth, where the warm water outlet 501 and colder water outlet 502 is used to mix and cool the temperature of surrounding water. The THEH system 101 can contribute to the preservation of marine ecosystems, addressing issues such as coral bleaching and biodiversity loss caused by rising ocean temperatures.

The THEH system 101 shall be a stationary system in the fact that the system does not need to move to function, it will only need fluid within the system to be moved. However, the system itself can be moved or in motion and still function as needed. One such example would be if the unit is being used on a ship or other floating vessel.

CONCLUSION

The THEH system represents an advancement in renewable energy, combining consistent energy generation with environmental preservation. Unbound by the limitations of solar and wind energy, the THEH system not only meets the need for sustainable energy but also actively contributes to mitigating challenges associated with rising ocean temperatures. Its balanced approach to energy efficiency and environmental preservation positions THEH as a pioneering solution in the integrated landscape of renewable energy and ecological conservation.

What is claimed is:

1. A THEH system comprising;

a. An array of solid-state thermal electrical generators that generate electricity based on a natural temperature difference between water at different depths;

b. warm water, wherein the temperature of the warm water is based on the temperature of water at a shallower depth in a body of water;

c. cold water, wherein the temperature of the cold water is based on the temperature of water at a deeper depth in a body of water;

d. multiple warm-side fluid-to-plate heat exchangers, wherein one side of the warm-side heat exchangers is thermally coupled to the warm water and the other side of the warm-side heat exchangers is thermally coupled to the array of solid-state thermal electrical generators;

e. multiple cold-side fluid-to-plate heat exchangers, wherein one side of the cold-side heat exchangers is thermally coupled to the cold water and the other side of the cold-side heat exchangers is thermally coupled to the array of solid-state thermal electrical generators;

f. a warm-side thermally insulated piping system that include an electrically driven warm-side water pump where the inlet and outlet of the warm water are at similar depths in the body of water;

g. a cold-side thermally insulated piping system that include an electrically driven cold-side water pump where the inlet and outlet of the cold water are at similar depths in the body of water.

2. The THEH system in claim 1 where in the system;

a. itself is stationary and does not need to move to operate;

b. temporarily needs external power to run the warm and cold-side water pumps to create an initial temperature difference to become electrically self-sustaining;

c. creates excess electricity once self-sustaining.

3. The THEH system in claim 1, where in the array of solid-state electrical generator comprising of numerous smaller plate-like thermoelectric generators electrically wired together.

4. The THEH system in claim 1, wherein the thermally insulated piping system;

a. will provide a primarily parallel flow of warm inlet water to the multiple warm-side fluid-to-plate heat exchangers;

b. will provide a primarily parallel flow of cold inlet water to the multiple cold-side fluid-to-plate heat exchangers.

5. A THEH system comprising;

a. An array of solid-state thermal electrical generators that generate electricity based on a natural temperature difference between water at different depths;

b. warm water, wherein the temperature of the warm water is based on the temperature of water at a shallower depth in a body of water;

c. cold water, wherein the temperature of the cold water is based on the temperature of water at a deeper depth in a body of water;

d. multiple warm-side fluid-to-plate heat exchangers, wherein one side of the warm-side heat exchangers is thermally coupled to the warm water and the other side of the warm-side heat exchangers is thermally coupled to the array of solid-state thermal electrical generators;

e. multiple cold-side fluid-to-plate heat exchangers, wherein one side of the cold-side heat exchangers is thermally coupled to the cold water and the other side of the cold-side heat exchangers is thermally coupled to the array of solid-state thermal electrical generators;

f. a closed loop partially thermally insulated piping system that include an electrically driven warm-side fluid pump;

g. a closed loop partially thermally insulated piping system that include an electrically driven cold-side fluid pump;

h. a warm-side fluid that is kept separate from the warm water within the body of water;

i. a cold-side fluid that is kept separate from the cold water within the body of water;

j. a warm-side fluid, wherein the temperature of the warm-side fluid is based on the temperature of water at a shallower depth in a body of water;

k. a cold-side fluid, wherein the temperature of the cold-side fluid is based on the temperature of water at a deeper depth in a body of water.

6. The THEH system in claim 5, wherein the closed loop partially thermally insulated piping system;

a. will provide a primarily parallel flow of warm fluid to the multiple warm-side fluid-to-plate heat exchangers;

b. will provide a primarily parallel flow of cold fluid to the multiple cold-side fluid-to-plate heat exchangers.

7. A THEH system comprising;

a. An array of solid-state thermal electrical generators that generate electricity based on a natural temperature difference between water at different depths;

b. warm water, wherein the temperature of the warm water is based on the temperature of water at a shallower depth in a body of water;

c. cold water, wherein the temperature of the cold water is based on the temperature of water at a deeper depth in a body of water;

d. multiple warm-side fluid-to-plate heat exchangers, wherein one side of the warm-side heat exchangers is thermally coupled to the warm water and the other side of the warm-side heat exchangers is thermally coupled to the array of solid-state thermal electrical generators;

e. multiple cold-side fluid-to-plate heat exchangers, wherein one side of the cold-side heat exchangers is thermally coupled to the cold water and the other side of the cold-side heat exchangers is thermally coupled to the array of solid-state thermal electrical generators;

f. a warm-side thermally insulated piping system that include an electrically driven warm-side water pump where the warm water inlet and the warm water outlet are not at similar depths in the same body of water to cool or warm surrounding water at the warm water outlet depth;

g. a cold-side thermally insulated piping system that include an electrically driven cold-side water pump where the cold water inlet and the cold water outlet are not at similar depths in the same body of water to cool or warm surrounding water at the warm water outlet depth.

8. The THEH system in claim 7, wherein the thermally insulated piping system;

a. will provide a primarily parallel flow of warm inlet water to the multiple warm-side fluid-to-plate heat exchangers;

b. will provide a primarily parallel flow of cold inlet water to the multiple cold-side fluid-to-plate heat exchangers.

* * * * *